(12) United States Patent
Kang et al.

(10) Patent No.: US 7,939,365 B2
(45) Date of Patent: May 10, 2011

(54) PHASE CHANGE MEMORY DEVICE, MANUFACTURING METHOD THEREOF AND OPERATING METHOD THEREOF

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 249 days.

(21) Appl. No.: 12/134,388

(22) Filed: Jun. 6, 2008

(65) Prior Publication Data
US 2009/0067228 A1    Mar. 12, 2009

(30) Foreign Application Priority Data
Sep. 6, 2007    (KR) .................. 10-2007-0090559

(51) Int. Cl.
*H01L 21/44* (2006.01)
(52) U.S. Cl. ............ 438/102; 438/533; 438/800; 257/2; 257/E21.002
(58) Field of Classification Search .................. 438/102, 438/533, 800; 257/2, E21.002
See application file for complete search history.

(56) References Cited

U.S. PATENT DOCUMENTS

| 6,531,373 B2 * | 3/2003 | Gill et al. ...................... 438/400 |
| 6,903,361 B2 * | 6/2005 | Gilton ................................ 257/2 |
| 2003/0132501 A1 | 7/2003 | Gill et al. |
| 2006/0243973 A1 | 11/2006 | Gilton |

FOREIGN PATENT DOCUMENTS

| KR | 2005-0058931 A | 6/2005 |
| KR | 1020060001060 A | 1/2006 |

* cited by examiner

*Primary Examiner* — Zandra Smith
*Assistant Examiner* — Christy L Novacek
(74) *Attorney, Agent, or Firm* — Ladas & Parry LLP (57) ABSTRACT

A phase change memory (PCM) device, a manufacturing technique of making the PCM device, and a way of operating the PCM device is presented. The PCM device is structured to have a silicon on insulator type substrate that provides an advantage of thermally insulating the active area of the PCM device without the need for an additional insulation layer. The PCM device has a phase change resistor PCR that has one terminal connected to a word line and the other terminal connected in common to the N-terminals of two PN diodes in which the P-terminals are connected in common to the bit line. As a result, a current flowing through the phase change resistor PCR is doubled which results in doubling the cell driving capacity.

8 Claims, 12 Drawing Sheets

PHASE CHANGE MEMORY DEVICE, MANUFACTURING METHOD THEREOF AND OPERATING METHOD THEREOF

CROSS-REFERENCE TO RELATED APPLICATION

This application is based upon and claims the benefit of priority to Korean Patent Application No. 10-2007-0090559, filed on Sep. 6, 2007, the entire contents of which are incorporated herein by reference.

BACKGROUND OF THE INVENTION

The present invention generally relates to phase change memory devices, more particularly, to phase change memory device capable of increasing a write current flowing in a phase change resistor for improving the cells driving capacity.

Nonvolatile memory devices that include magnetic memory devices and phase change memory (PCM) devices have data processing speeds similar to those of volatile Random Access Memory (RAM) devices. Furthermore nonvolatile memory devices enjoy the advantage associated with conserving data even after the power is turned off.

Figure 1A:
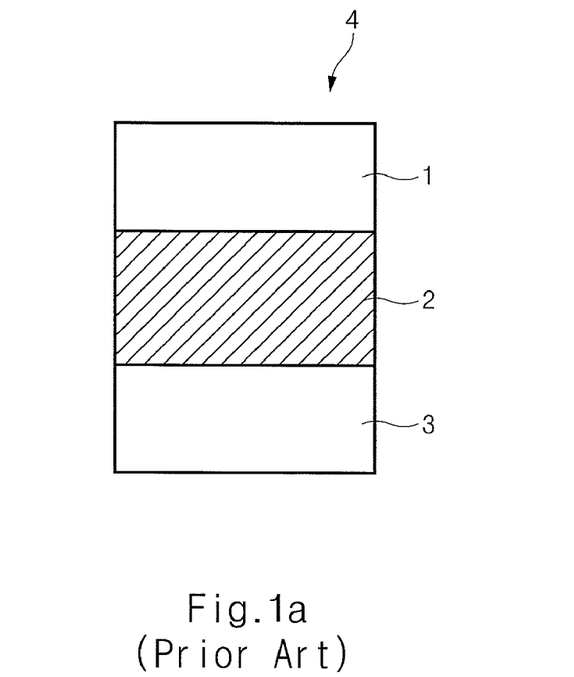
FIGS. 1a and 1b are diagrams illustrating a conventional phase change resistor.
Figure 1B:
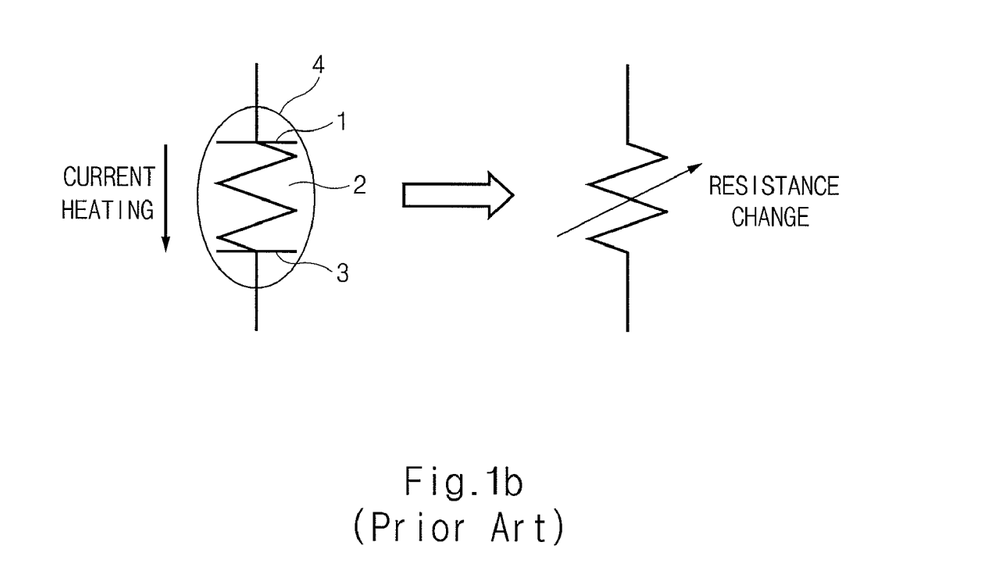

FIGS. 1a and 1b are diagrams illustrating a conventional phase change resistor (PCR) 4.

The PCR 4 comprises a phase change material (PCM) 2 inserted between a top electrode 1 and a bottom electrode 3. When an electrical signal having a voltage and a current is transmitted through the PCM 2, an elevated temperature can be generated in the PCM 2 so that the electric conductive state of the PCR 4 can be controlled or changed depending on whether or not the heated PCM 2 can be slowly cooled as a crystalline lattice structure or rapidly cooled as an amorphous lattice structure. That is the resistance of the crystalline lattice of the PCM 2 exhibits a lower resistance than the resistance of the amorphous lattice of the PCM 2.

One PCM 2 of interest includes AgLnSbTe. The PCM 2 includes chalcogenide having chalcogen elements (S, Se, Te) as a main ingredient. Another PCM 2 of interest includes the germanium antimonic tellurium (Ge2Sb2Te5).

Figure 2A:
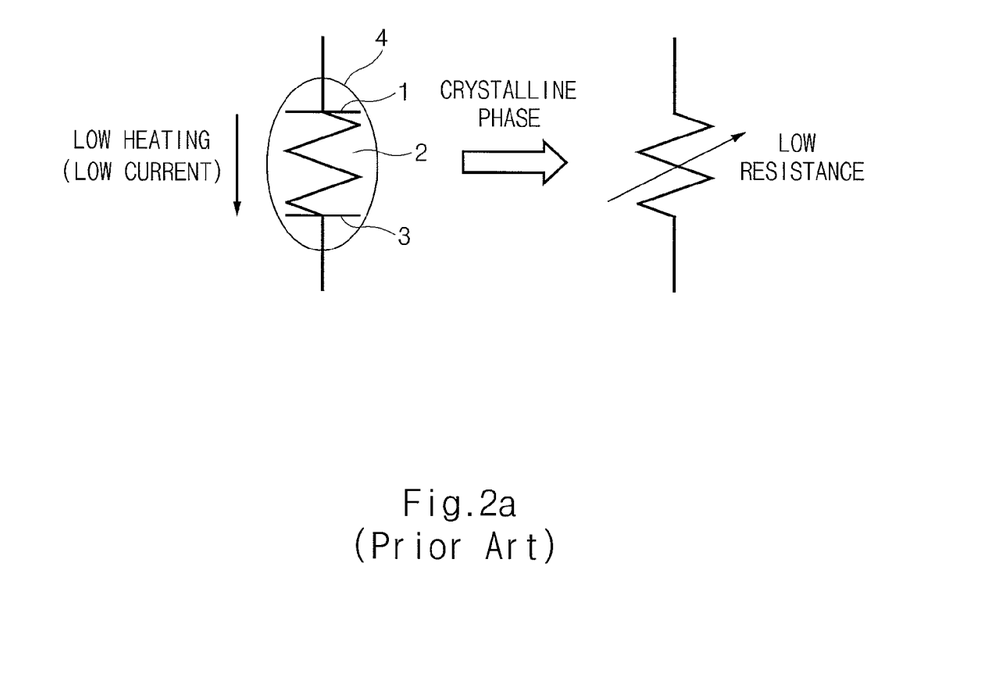
FIGS. 2a and 2b are diagrams illustrating a principle of the conventional phase change resistor.
Figure 2B:
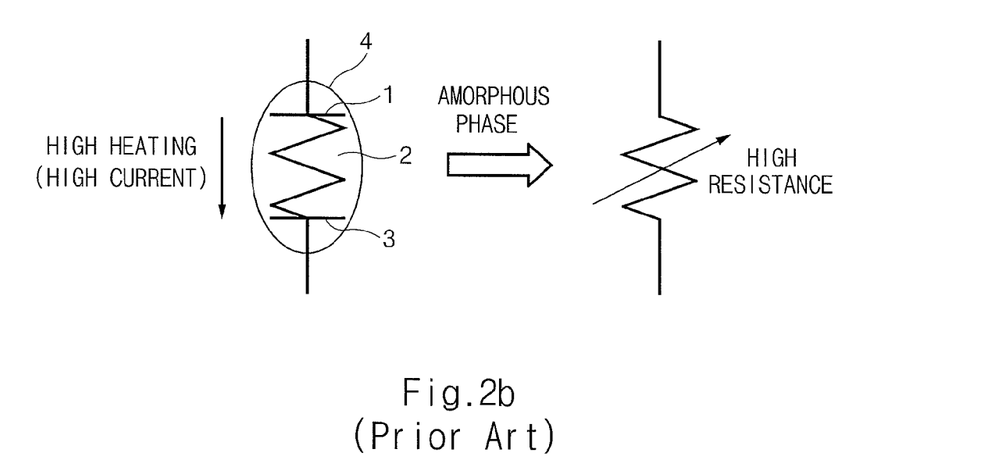

FIGS. 2a and 2b are diagrams illustrating a principle of the conventional PCR 4.

As shown in FIG. 2a, the PCM 2 can be crystallized when relatively low currents of less than a threshold pass through the PCM R. As a result, the PCM 2 can be crystallized to exhibit a low resistant material.

As shown in FIG. 2b, the PCM 2 has a temperature of a more than a melting point when a high current of more than a threshold passes through the PCR 4. As a result, the PCM 2 can become an amorphous lattice that exhibits a relatively high resistance.

In this way, the PCR 4 can be configured to store nonvolatile data corresponding to the two resistance states. For instance, a logical data state of "1" can be assigned to correspond to the PCR 4 when at a low resistance state. Likewise, a logical data state of "0" can be assigned to correspond to the PCR 4 when at a high resistance state. In this way, the logic states of the two data can be stored.

Figure 3:
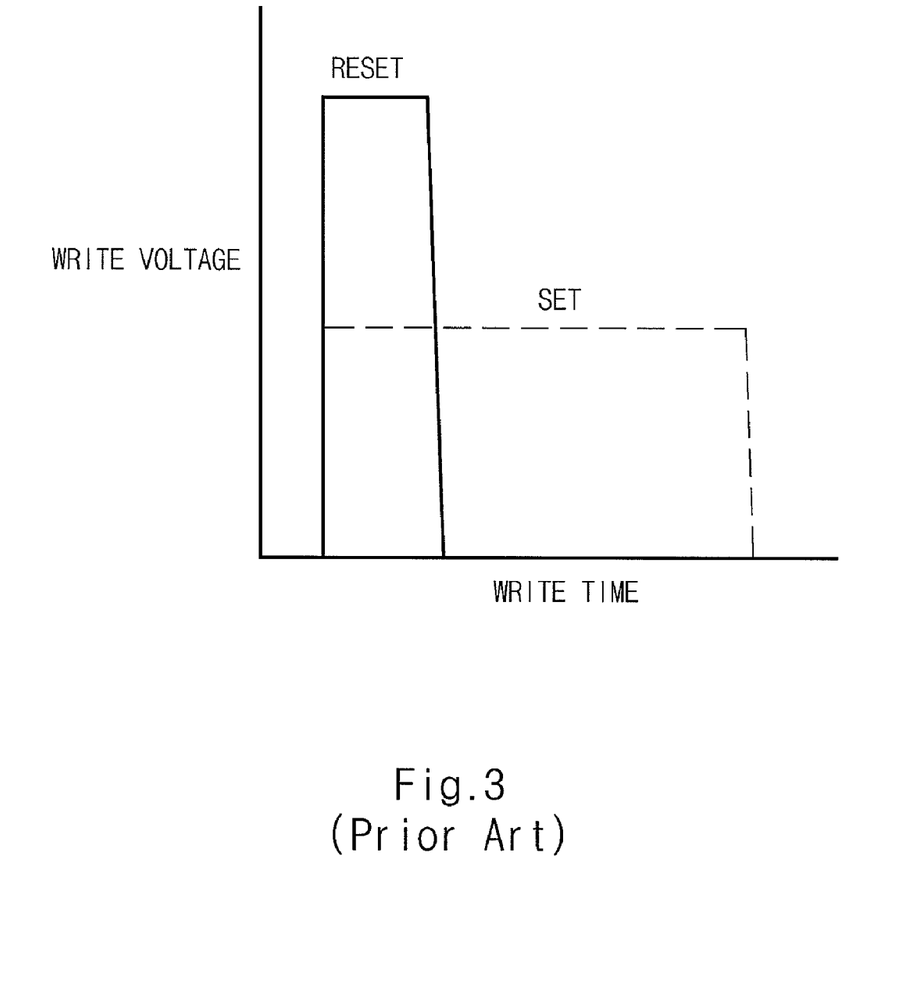
FIG. 3 is a diagram illustrating a write operation of a conventional phase change resistant cell.

FIG. 3 is a diagram illustrating a write operation of a conventional phase change resistant cell.

Heat is generated when a current flows between the top electrode 1 and the bottom electrode 3 of the PCR 4 for a given amount of time. As a result, a state of the PCM 2 can be changed to be either crystalline or amorphous depending upon what temperature was applied between the top electrode 1 and the bottom electrode 3.

When a low current flows for a given time, the PCM can become crystalline during a low temperature heating state so that the PCR 4 can be set to a low resistive set state. On the other hand, when a high current flows for a given amount of time, the PCM can become amorphous due to the generated high temperature heating state so that the PCR 4 can be set to a high resistive reset state. A difference between two phases is representative of an electric resistance change.

A low voltage can be applied to the PCR 4 for a relatively long time period in order to write the set state in a write mode. On the other hand, a high voltage can be applied to the PCR 4 for a relatively short time period in order to write the reset state in the write mode.

SUMMARY OF THE INVENTION

Various embodiments of the present invention are directed at providing a phase change memory device comprising a phase change resistor connected in parallel to two diodes in order to increase a write current flowing in a phase change resistor by two fold, thereby improving cell driving capacity.

Various other embodiments of the present invention are directed at providing a phase change memory device comprising a phase change resistor connected in parallel to two diodes to reduce the cell size.

Various other embodiments of the present invention are directed at applying a set voltage with a step-type waveform so that a phase change resistor may be crystallized.

Various other embodiments of the present invention are directed at forming a phase change resistance cell over a SOI (Silicon On Insulator) substrate to insulate a silicon layer from the substrate with an oxide film without the need of using an additional process for insulating the silicon layer from the substrate.

According to an embodiment of the present invention, a manufacturing method of a phase change memory device comprises: forming a first impurity region in a semiconductor substrate; forming a first insulating layer including a bottom electrode over the semiconductor substrate; forming a phase change layer and a top electrode connected to the bottom electrode over the first insulating layer; and forming a second impurity region in the first impurity region with the top electrode as an ion-implanting mask.

According to an embodiment of the present invention, an operating method of a phase change memory device, which comprises: a cell array including a phase change resistor connected to a word line and a phase change resistance cell having first and second diodes connected between the phase change resistor and a bit line; and a write driving unit configured to supply a write voltage corresponding to data to be written to the cell array unit, comprises: activating a selected word line in a write mode; applying the write signal to a selected bit line. When the data corresponds to a reset state, the write signal has a reset voltage imposed at a reset time period. When the data corresponds to a set state, the write signal has a first set voltage imposed at a first set time period, followed by a second set voltage imposed at a second set time period, and followed by a third set voltage imposed at a third set time period.

According to another embodiment of the present invention, the phase change memory device comprises: a first impurity region and a second impurity region formed alternately over a substrate; a phase change resistor connected to a top portion of the first impurity region; a bit line contact plug formed over the second impurity region; and a bit line connected in common to the bit line contact plug.

DETAILED DESCRIPTION

FIGS. 4a to 4h are cross-sectional diagrams illustrating a manufacturing method of a phase change memory device according to an embodiment of the present invention.

Referring to FIG. 4, a N-type substrate 10 which is a bare wafer is formed. An insulating layer 12 is shown formed over the N-type substrate 10. The insulating layer 12 can include an oxide film.

Figure 4A:
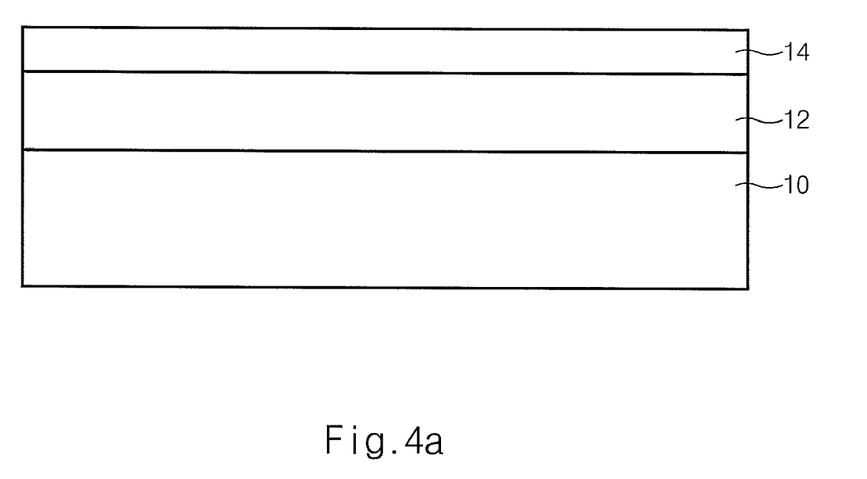
FIGS. 4a to 4h are cross-sectional diagrams illustrating a manufacturing method of a phase change memory device according to an embodiment of the present invention.

A silicon layer 14 is formed over the insulating layer 12. As a result, a silicon-on-insulator (SOI) type substrate is prepared. The insulator layer 12 of the SOI type substrate may provide the advantage of insulating the silicon layer 14 from the N-type substrate 10 without the need for implementing any additional processes for insulating the silicon layer 14 from the N-type substrate 10.

Figure 4B:
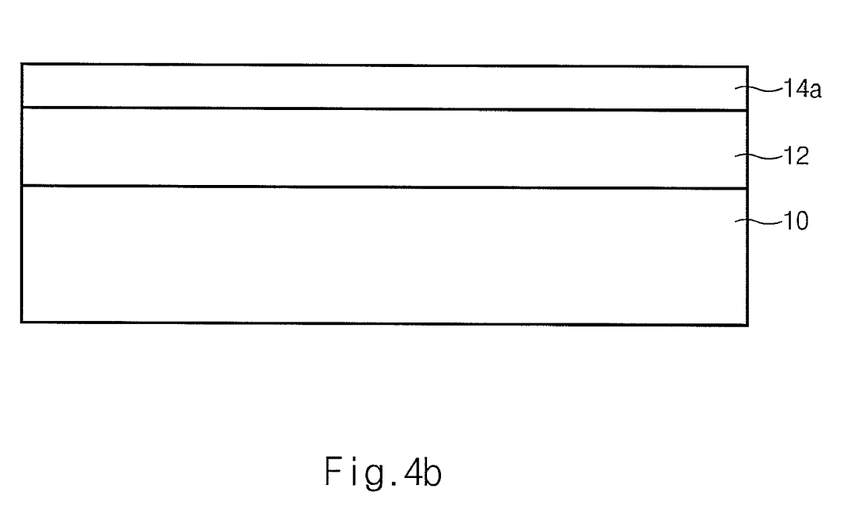

Referring to FIG. 4b, N+ type impurity ions are implanted into the silicon layer 14 to form a N+ region 14a. The N+ region 14a is positioned to form a structure of a PN diode D. The N+ region 14a may be obtained by ion-implanting N-type impurities such as As and P with high concentration.

Figure 4C:
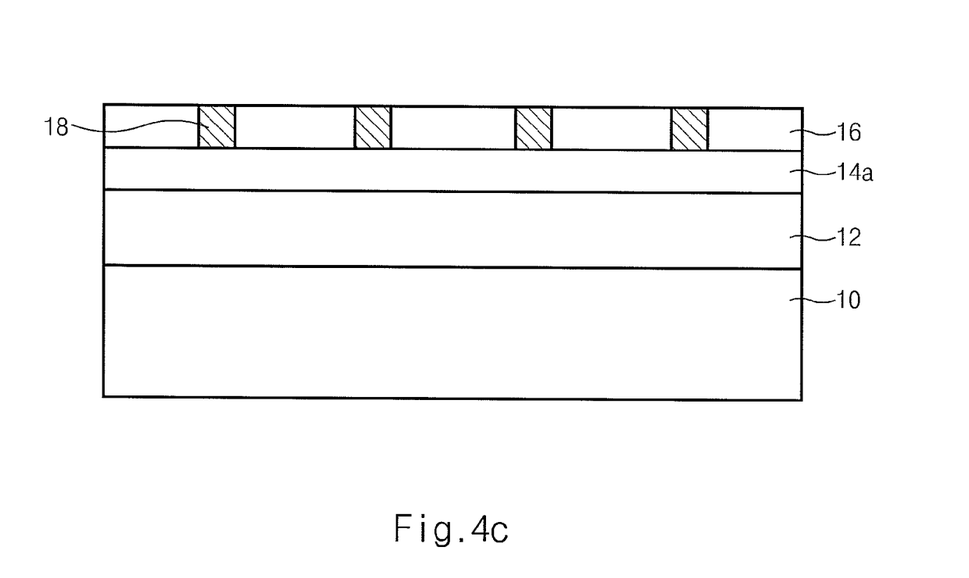

Referring to FIG. 4c, an insulating layer 16 is formed over the N+ region 14a. The insulating layer 16 is selectively etched to form a plurality of contact holes (not shown) for exposing the N+ region 14a which are separated with a given interval. A conductive film for bottom electrode is filled in the contact holes to form a bottom electrode 18.

Figure 4D:
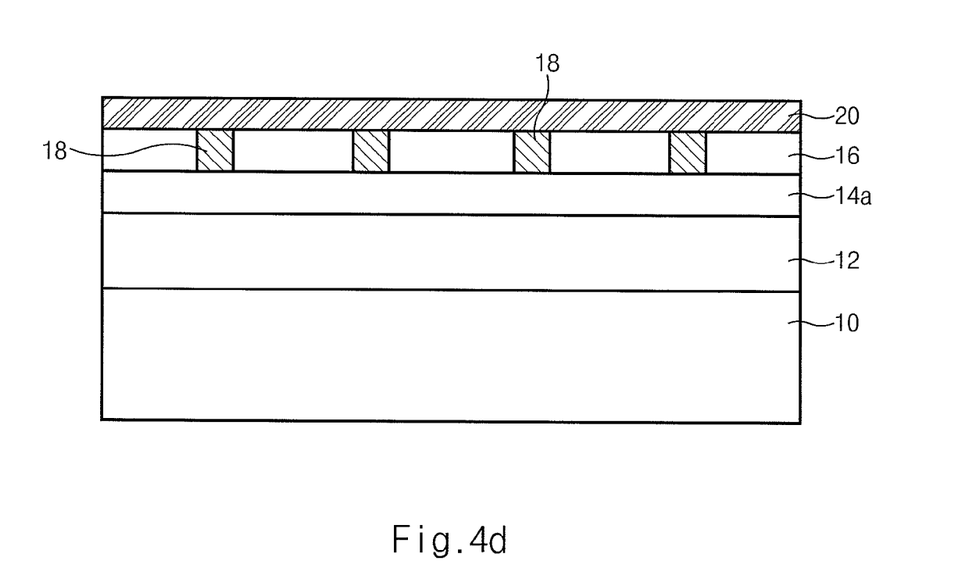

Referring to FIG. 4d, a phase change layer 20 is formed over the insulating layer 16 and the bottom electrode 18. The phase change layer 20 can be any phase change material. Some preferred phase change materials are those selected from one of AgInSbTe and Ge2Sb2Te5.

Figure 4E:
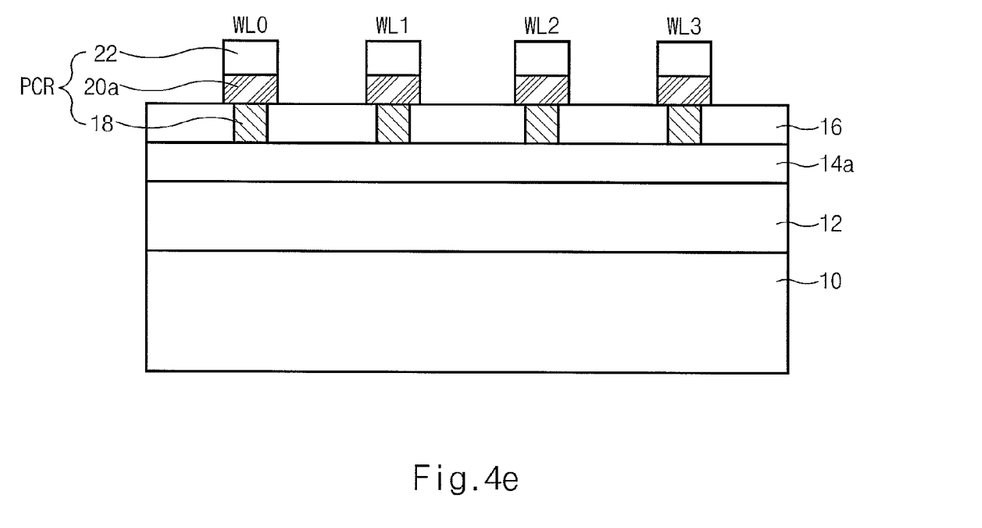

Referring to FIG. 4e, a conductive film for top electrode is formed over the phase change layer 20. The conductive film for forming the top electrode is selectively etched to form a top electrode 22. The phase change layer 20 is selectively etched with the top electrode 22 as an etching mask to form a phase change layer 20a overlapped with the bottom electrode 18.

As a result, a phase change resistor PCR is formed which includes the bottom electrode 18, the phase change layer 20a and the top electrode 22.

Figure 4F:
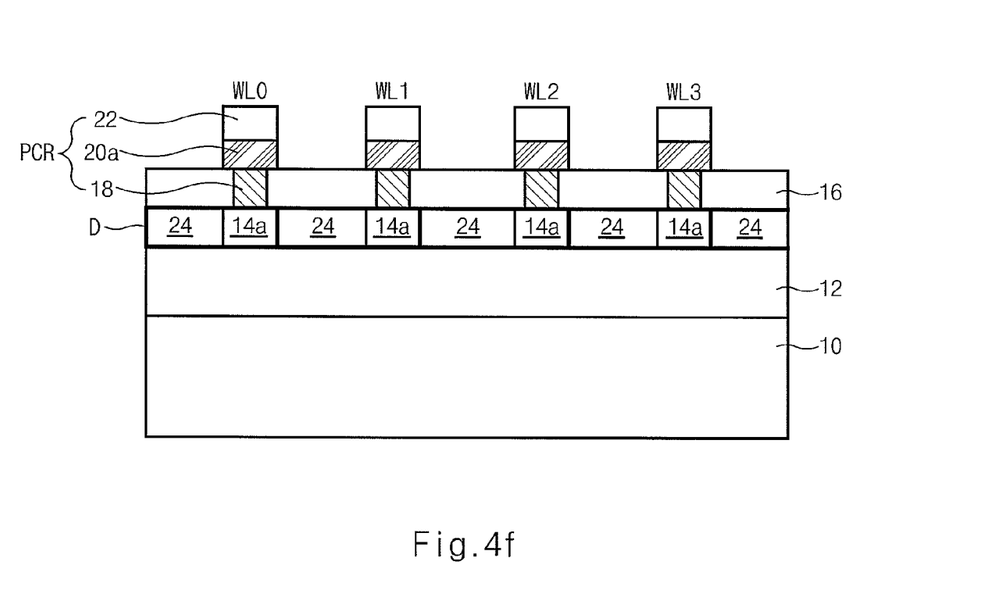

Referring to FIG. 4f, P+ type impurity ions are implanted into the N+ region 14a by using the top electrode 22 as an ion-implanting mask to form a P+ region 24. The P+ region 24 may be formed in a local bit line contact region connected to a bit line contact plug.

A PN diode D includes the P+ region 24 and the N+ region 14a. In the PN diode D, the P+ regions 24 are formed to be connected serially to the N+ regions 14a in the same layer. That is, there is no space between the P+ region 24 and the N+ region 14a to reduce a cell size.

Figure 4G:
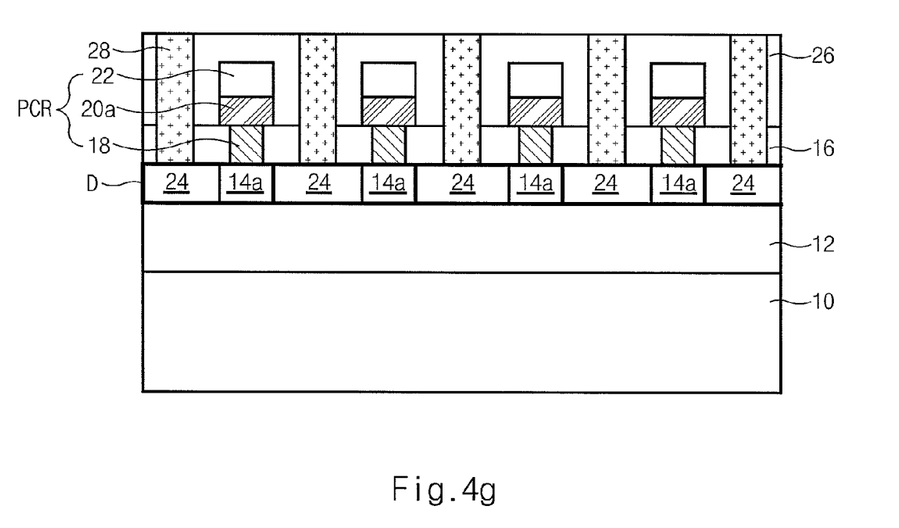

Referring to FIG. 4g, an insulating layer 26 is formed over the resulting structure. The insulating layers 16 and 26 are selectively etched to form a plurality of contact holes (not shown) for exposing the P+ region 24. The insulating layers 16 and 26 are etched except a region where the phase change resistor PCR is formed.

A conductive film for bit line contact is filled in the contact holes to form a bit line contact plug 28.

Figure 4H:
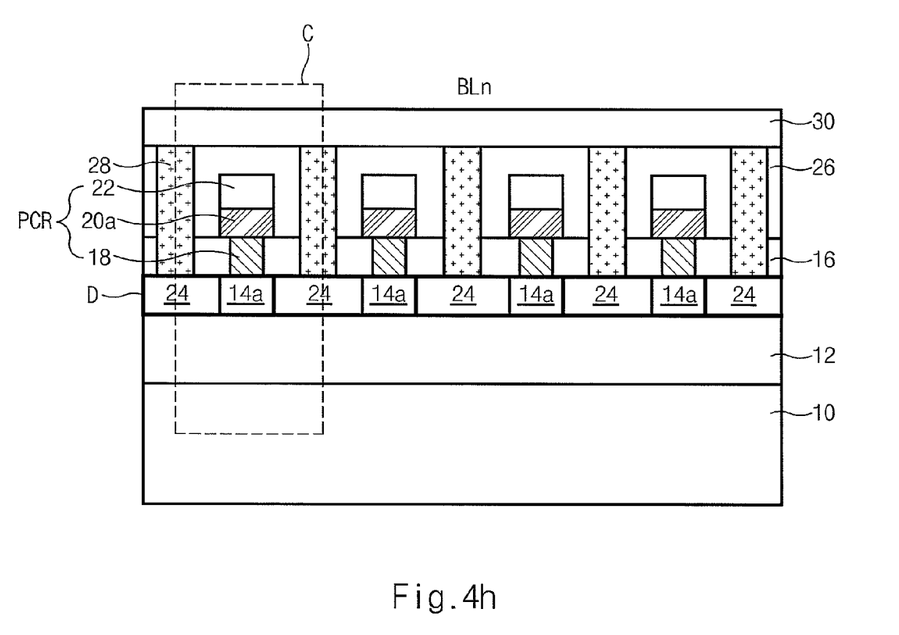

Referring to FIG. 4h, a bit line 30 connected to the bit line contact plug 28 is formed over the insulating layer 26 and the bit line contact plug 28. A phase change resistance cell C including the phase change resistor PCR and the PN diode D is formed.

The top electrodes 22 of the phase change resistors PCR are connected to a plurality of word lines WL0~WL3, and the bottom electrodes 18 are connected to the N type regions 14a of the PN diodes D. The P type regions 24 of the PN diodes D are connected to the bit line 30 through the bit line contact plug 28.

That is, the N type regions 14a of the PN diodes D1, D2 are connected in common to the bottom electrodes 18. As a result, the PN diodes D1, D2 are connected in parallel between the bottom electrode 18 and the bit line 30 of the phase change resistor PCR.

Figure 5:
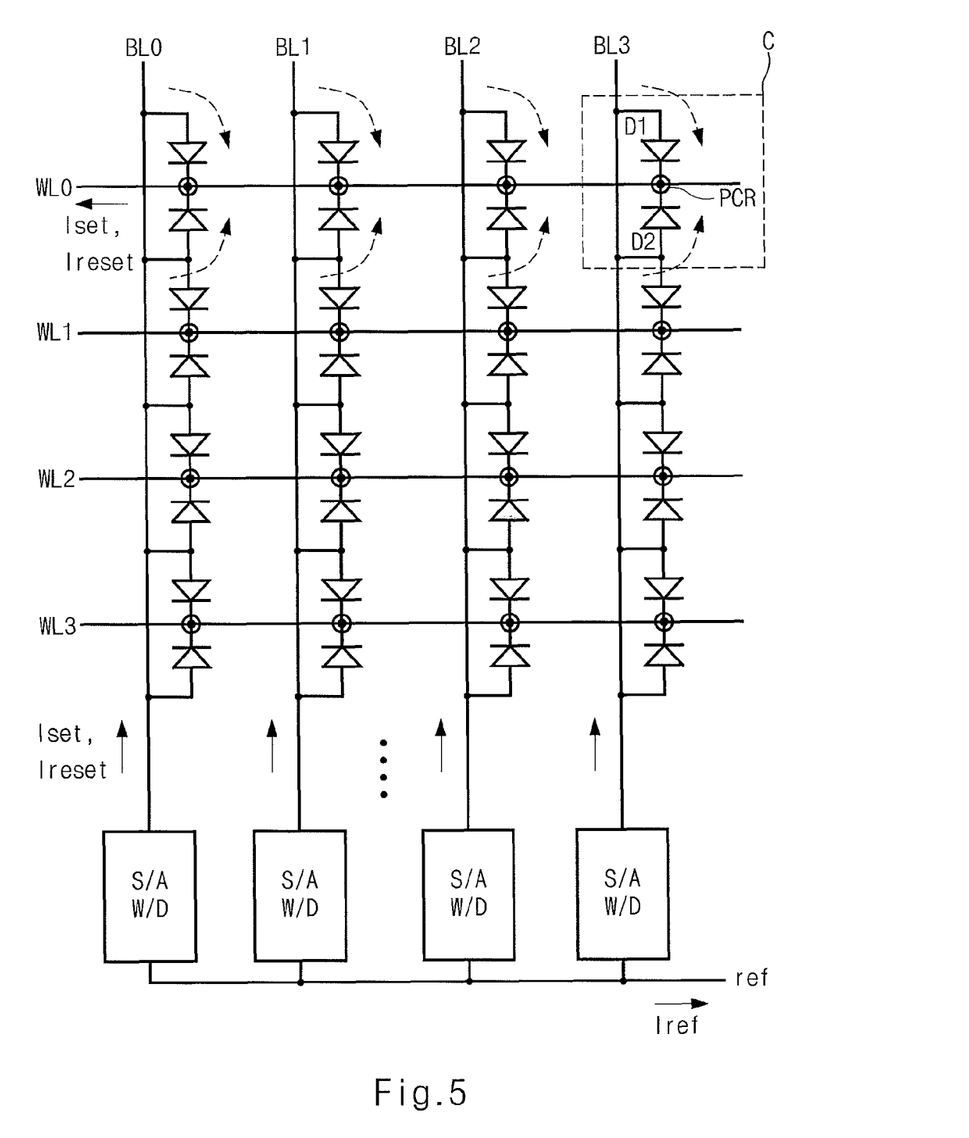
FIG. 5 is a diagram illustrating a cell array of a phase change memory device according to an embodiment of the present invention.

FIG. 5 is a diagram illustrating a cell array of a phase change memory device according to an embodiment of the present invention.

The phase change memory device includes a plurality of bit lines BL0~BL3 arranged in a column direction and a plurality of word lines WL0~WL3 arranged in a row direction. A plurality of unit cells C are arranged at intersections of the bit lines BL0~BL3 and the word lines WL0~WL3. The unit cell C includes a phase change resistor PCR and PN diodes D1, D2.

The phase change resistor PCR has one terminal connected to the word line WL and the other terminal connected in common to a N type region of the PN diodes D1, D2. The PN diodes D1, D2 are arranged in parallel to the bit line BL. The PN diodes D1, D2 each have a P-type region connected in common to the bit line BL and each N type region connected to the other terminal of the phase change resistor PCR. In the phase change resistance cell C, a phase of the phase change resistor PCR is changed depending on a set current Iset and a reset current Ireset flowing in the bit line BL to write data.

That is, the phase change resistor PCR includes the two diodes D1, D2 connected in parallel. The set current Iset or the reset Ireset flowing through each bit line BL is applied to the phase change resistor PCR through the two PN diodes D1, D2. As a result, a current flowing through the phase change resistor PCR is increased by twice which results in doubling the cell driving capacity.

The sense amplifier S/A senses a cell data received through the bit line BL and compares the cell data with a reference voltage ref to distinguish a set data from a reset data. The reference current Iref flows in a reference voltage ref receiving terminal. When writing a data in the phase change resistance cell C, the write driving unit W/D supplies a write voltage corresponding to a data state to the bit line BL.

Figure 6:
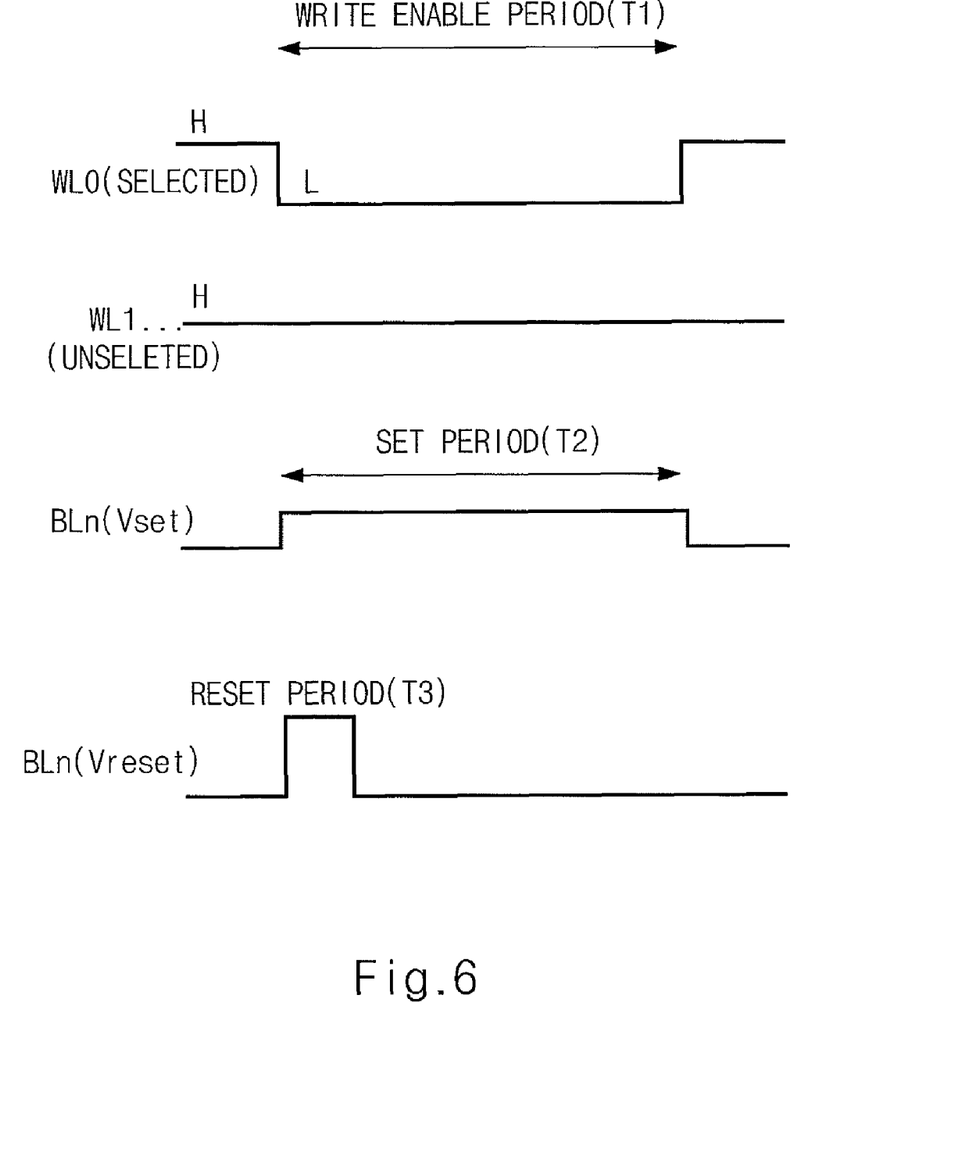
FIG. 6 is a timing diagram illustrating a write operation of a phase change memory device according to an embodiment of the present invention.

FIG. 6 is a timing diagram illustrating a write operation of a phase change memory device according to an embodiment of the present invention.

In a write mode, the word line WL0 of the word lines WL0~WL3 is selected. The word line WL0 is activated by transitioning from a high level to a low level during a write enable period T1. The other reset word lines WL1~WL3 remain inactivated at a high level.

The write driving unit W/D applies a write voltage to the corresponding bit line BL of the bit lines BL0~BL3.

When data is to be written as a set data, a set write voltage Vset is applied to the corresponding bit line BL for a set period T2. The set write voltage Vset is applied to the phase change resistor PCR through the PN diodes D1, D2 of the phase change resistance cell C. As a result, the set data is written in the phase change resistance cell C.

When data is to be written as a reset data, a reset write voltage Vreset is applied to the corresponding bit line BL for a reset period T3. The reset write voltage Vreset is applied to the phase change resistor PCR through the PN diodes D1, D2 of the phase change resistance cell C. As a result, the reset data is written in the phase change resistance cell C.

The set write voltage Vset and the reset write voltage Vreset can be applied as a single pulse. The set write voltage Vset has a voltage level lower than that of the reset write voltage Vreset. The set period T2 may be longer than the reset period T3.

Figure 7:
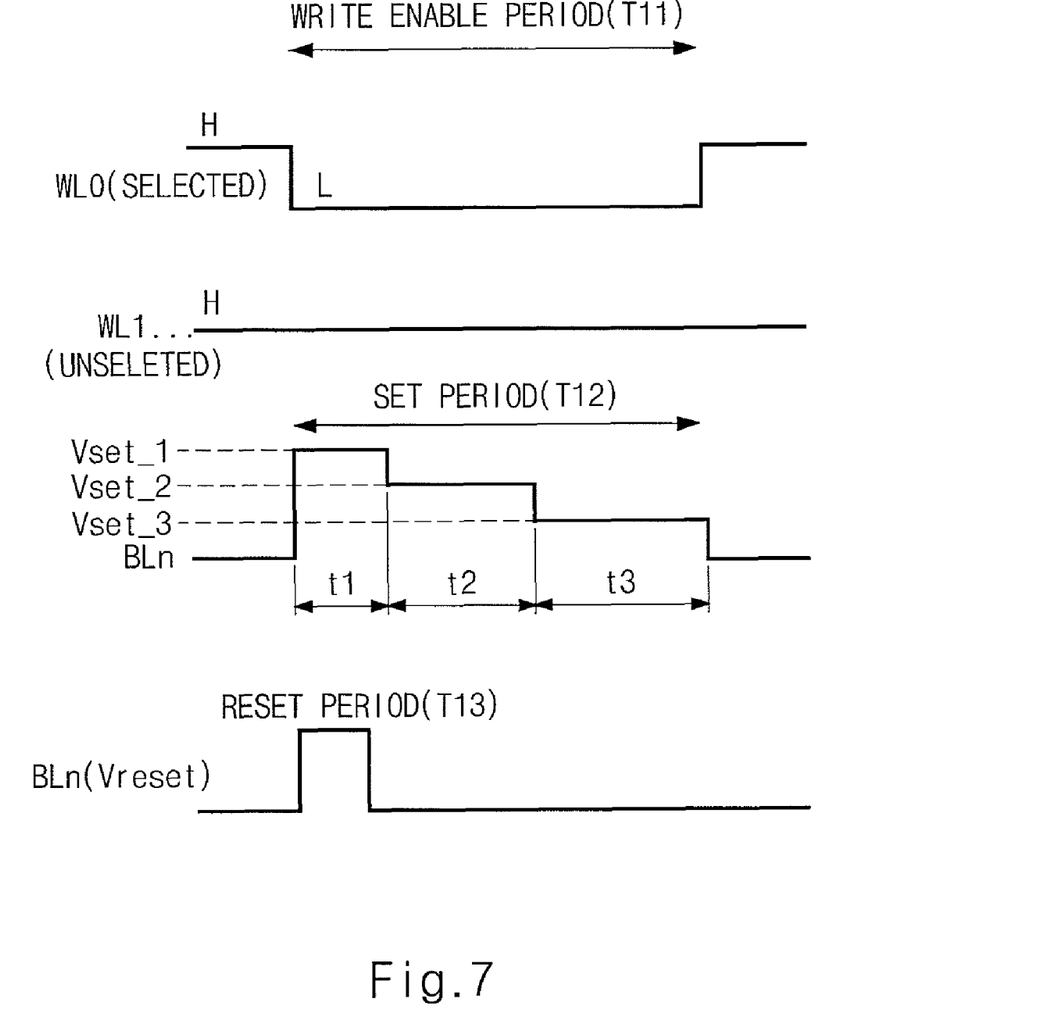
FIG. 7 is a timing diagram illustrating a write operation of a phase change memory device according to an embodiment of the present invention.

FIG. 7 is a timing diagram illustrating a write operation of a phase change memory device according to an embodiment of the present invention.

In a write mode, the corresponding word line WL0 of the word lines WL0~WL3 is selected. The word line WL0 is activated by transitioning from a high level to a low level during a write enable period T11. The other reset word lines WL1~WL3 remain inactivated at a high level.

The write driving unit W/D applies a write voltage to the corresponding bit line BL of the bit lines BL0~BL3.

When a data to be written as a set data, set write voltages Vset_1~Vset_3 are sequentially applied to the corresponding bit line BL for a set period T12. The set write voltages Vset_1~Vset_3 are series of step pulses which decrease discretely.

In the set period T12, the first set voltage Vset_1 is applied to the bit line BL for a first write time t1. The second set voltage Vset_2 is applied to the bit line BL for a second write time t2. The third set voltage Vset_3 is applied to the bit line BL for a third write time t3.

The first set voltage Vset_1 has the same voltage level as that of the reset write voltage Vreset. The second set voltage Vset_2 has a voltage level lower than that of the first set voltage Vset_1. The third set voltage Vset_3 has a voltage level lower than that of the second set voltage Vset_2.

When data to be written is a reset data, a reset write voltage Vreset is applied to the corresponding bit line BL for a reset period T13. The reset write voltage Vreset is applied to the phase change resistor PCR through the PN diodes D1, D2 of the phase change resistance cell C. As a result, the reset data is written in the phase change resistance cell C.

The reset write voltage Vreset is applied as a single pulse. The set period T12 may be longer than the reset period T13.

Figure 8:
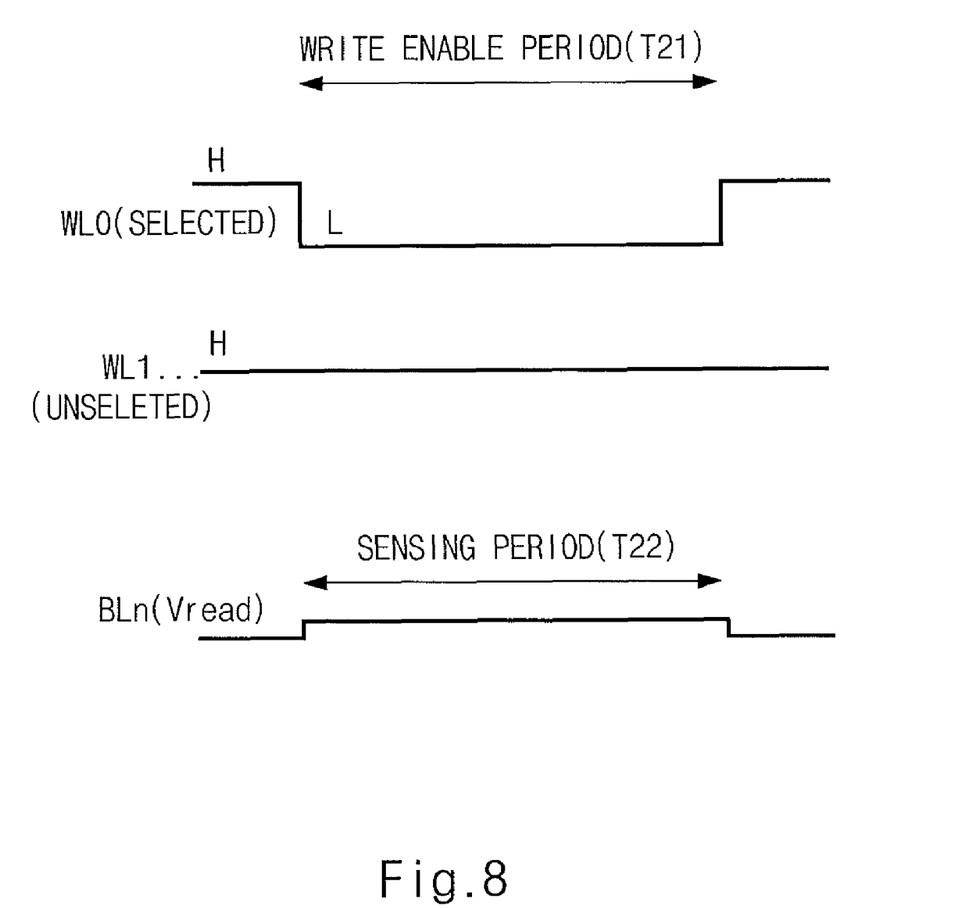
FIG. 8 is a timing diagram illustrating a read operation of a phase change memory device according to an embodiment of the present invention.

FIG. 8 is a timing diagram illustrating a read operation of a phase change memory device according to an embodiment of the present invention.

In a read mode, the word line WL0 of the word lines WL0~WL3 is selected. The word line WL0 is activated by transiting from a high level to a low level during a read enable period T21. The other reset word lines WL1~WL3 remain inactivated at a high level.

A read voltage Vread is applied to the corresponding bit line BL of the bit lines BL0~BL3 for a sensing period T22. The set current Iset or the reset current Ireset flows toward the selected word line WL0 through the bit line BL, the phase change resistor PCR and the PN diodes D1, D2.

The sense amplifier S/A senses a cell data received through the bit line BL and compares the reference current Iref with the set current Iset or the reset current Ireset to distinguish data "0" from data "1".

Figure 9:
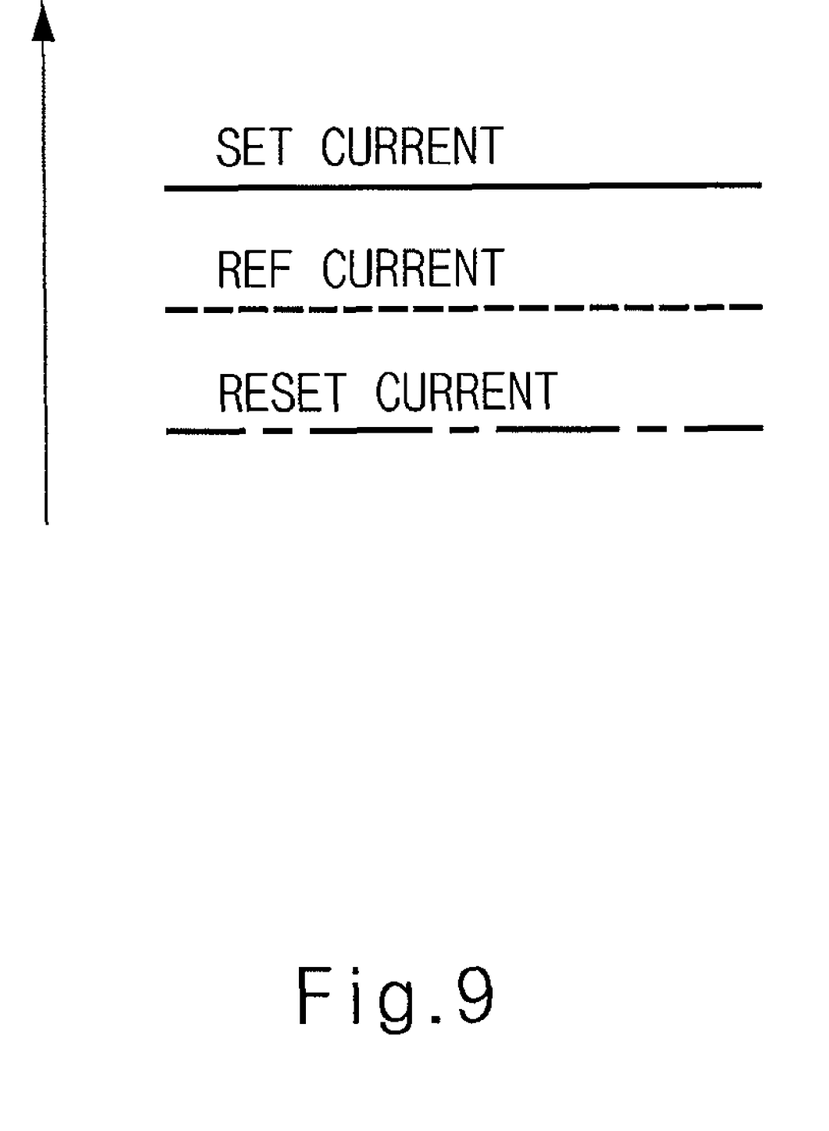
FIG. 9 is a diagram illustrating a current level between sensing currents in a read mode.

FIG. 9 is a diagram illustrating a current level between sensing currents in a read mode.

In the read mode, the set current Iset has the largest current value, and the reset current Ireset has the smallest current value in a current level of the sensing current. The reference current Iref has a middle value of the values of the set current Iset and the reset current Ireset.

As described above, according to an embodiment of the present invention, a phase change memory device comprises a phase change resistor connected in parallel to two diodes to increase a write current substantially doubles by flowing in a phase change resistor Thereby the present invention can enjoy an improved cell driving capacity.

The phase change memory device comprises a phase change resistor connected in parallel to two diodes results in decreasing the cell size.

In the phase change memory device, a set voltage is applied with a step-type waveform so that a phase change resistor may be crystallized.

In the phase change memory device, a phase change resistance cell is formed over a SOI-type substrate that insulates a silicon layer from the substrate with an oxide film without the need for an additional fabrication process for insulating the silicon layer from the substrate.

Although a number of illustrative embodiments consistent with the invention have been described, it should be understood that numerous other modifications and embodiments can be devised by those skilled in the art that will fall within the spirit and scope of the principles of this disclosure. More specifically, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A method of manufacturing a phase change memory device, the method comprising:
   forming a first impurity region having a N+ region in a semiconductor substrate;
   forming a first insulating layer comprising a bottom electrode connected to the first impurity region over the semiconductor substrate;
   forming a phase change layer which is connected to the bottom electrode and a top electrode over the first insulating layer;
   forming a second impurity region having a P+ region in the first impurity region by using the top electrode as an ion-implanting mask; and forming a bit line contact plug connected to the second impurity region,
wherein the first impurity region and the second impurity region are formed alternately in a same layer.

2. The manufacturing method according to claim 1, wherein the semiconductor substrate has a SOI (Silicon On Insulator) structure comprising a first silicon layer, an insulating layer and a second silicon layer.

3. The manufacturing method according to claim 2, wherein the first silicon layer comprises a N-type region.

4. The manufacturing method according to claim 1, wherein forming the bottom electrode comprises:
forming the first insulating layer over the semiconductor substrate;
forming a contact hole which exposes the first impurity region by etching the first insulating layer; and
filling the contact hole with a conductive film to form the bottom electrode.

5. The manufacturing method according to claim 1, wherein the top electrode is connected to a word line.

6. The manufacturing method according to claim 1, wherein the first impurity region and the second impurity region comprise a PN diode.

7. The manufacturing method according to claim 1, further comprising:
forming a bit line connected to the bit line contact plug.

8. The manufacturing method according to claim 7, wherein forming the bit line contact plug comprises:
forming a second insulating layer over the resulting structure including the phase change layer and the top electrode;
forming a contact hole that exposes the second impurity region by etching the second insulating layer; and
filling the contact hole with a conductive film.

* * * * *